United States Patent [19]

Byczek et al.

[11] Patent Number: 5,470,237
[45] Date of Patent: Nov. 28, 1995

[54] LATCH MECHANISM FOR JOINING THE COVER AND CONNECTOR OF A REMOVABLE MEMORY DEVICE

[75] Inventors: Roger W. Byczek, Lake in the Hills, Ill.; Randy Hendrich, Conneaut Lake; John J. Ashman, Huntingdon, both of Pa.

[73] Assignee: Elco Corporation, Huntingdon Park, Pa.

[21] Appl. No.: 262,997

[22] Filed: Jun. 20, 1994

[51] Int. Cl.⁶ .................................................. H01R 13/00
[52] U.S. Cl. ........................................... 439/76.1; 439/607
[58] Field of Search ..................... 439/76, 607, 73, 439/630, 629

[56] References Cited

U.S. PATENT DOCUMENTS

| | | | |
|---|---|---|---|
| 3,517,273 | 6/1970 | Bentley et al. | 317/101 |
| 3,704,455 | 11/1972 | Scarborough | 340/173 SP |
| 5,061,845 | 10/1991 | Pinnavaia | 235/492 |
| 5,137,472 | 8/1992 | Hillbish et al. | 439/607 |
| 5,141,445 | 8/1992 | Little | 439/607 X |
| 5,196,994 | 3/1993 | Tanuma et al. | 361/395 |
| 5,210,442 | 5/1993 | Ishimoto | 439/76 X |
| 5,242,310 | 9/1993 | Leung | 439/76 |
| 5,273,459 | 12/1993 | Davis | 439/607 |

*Primary Examiner*—David L. Pirlot
*Assistant Examiner*—Daniel Wittels
*Attorney, Agent, or Firm*—Spensley Horn Jubas & Lubitz

[57] ABSTRACT

A removable memory device includes a substrate, such as a printed circuit board, carrying IC memory packages; a connector including a molded plastic connector block for electrically connecting the removable memory device to a host system; and a sheet metal cover for enclosing the substrate. The cover has opposed forward edges including a plurality of forwardly projecting retention tabs received within a plurality of corresponding retention slots formed in the upper and lower outer surfaces of the connector block. The slots and tabs are preferably directed inwardly to provide a secure latched connection between the cover and connector.

2 Claims, 3 Drawing Sheets

LATCH MECHANISM FOR JOINING THE COVER AND CONNECTOR OF A REMOVABLE MEMORY DEVICE

FIELD OF THE INVENTION

This invention relates generally to removable memory devices and particularly to a latching mechanism for securely attaching the sheet metal cover to the insulative connector of such devices.

BACKGROUND OF THE INVENTION

Many of today's laptop, notebook, desktop and other computers, as well as computer peripherals and other electronic products are designed to receive removable memory devices. Such removable memory devices may be used for various purposes. For example, they can be used to supplement the semiconductor memory of a personal computer, or can be used to store information or data for use by the host system or for reconfiguring the host system in response to information stored in the integrated circuit packages mounted on the substrate. Removable memory devices typically comprise a substrate in the form of a card or printed circuit board carrying integrated circuit random access memory packages. The substrate is attached along one edge thereof to a multipole connector typically including a connector block of molded plastic having multiple contacts for electrically connecting the removable memory device to the host system by way of a port or other receptacle. A typical removable memory device further includes a sheet metal cover enclosing the memory card or board and secured to the plastic connector block. Presently, the metal cover is bonded to the plastic connector block by means of an adhesive. However, over a period of time and due to environmental changes, the adhesive eventually relaxes so as to allow the cover to become separated from the connector block. In addition, the application of adhesive requires secondary manufacturing steps and does not afford precise positioning of the cover relative to the connector block.

SUMMARY OF THE INVENTION

The present invention overcomes the above-described disadvantages of adhesively bonding the metal cover to the plastic connector block of a removable memory device. The invention eliminates the secondary manufacturing steps required for adhesively joining those parts and provides a cover-to-connector block joint that is impervious to environmental conditions. Moreover, the invention allows an authorized technician to open up the removable memory device by utilizing a special tool to separate the metal cover from the connector block. The invention thus permits reworking the removable memory device without damage to the connector block. Attempts to rework removable memory devices in which the metal cover is adhesively bonded to the connector block is both costly and messy. Thus, the invention provides a technique for joining the metal cover of a removable memory device to the associated connector block which will provide a connection that will stay together under harsh environmental and use conditions, and yet be relatively easy and inexpensive to rework should that become necessary.

More specifically, in accordance with one exemplary embodiment of the invention, the metal cover comprises upper and lower panels each having a forward edge provided with a plurality of projecting retention tabs adapted to be received by retention slots formed in upper and lower outer surfaces of the plastic connector block. Such a construction has been found to provide a reliable mechanical connection between the metal cover and the connector block.

In accordance with a specific feature of the invention, the slots are disposed at an angle to enhance the reliability of the connection between the cover and the connector block by securely latching these parts together to further prevent separation of the two during use.

The tab and slot technique of the present invention moreover provides accurate control over the location of the metal cover relative to the plastic connector block expediting assembly of the parts.

Further, by orienting the slots in the connector block at an angle, the lip or wall defining each slot is sufficiently thick and strong to hold down the metal cover without fracturing of the lip. By utilizing a plurality of short slots, each configured to receive a mating tab, instead of a single long, thin walled slot, warpage of the slot-defining lip across the width of the connector block is eliminated.

The number, geometry and location of the cover tabs may be varied depending on the application. For example, the tabs and receiving slots may be keyed so as to prevent attempts to remove the cover yet allow special tools to be used to open the cover. In addition, the cover material need not be metal; instead a conductive plastic could be used.

BRIEF DESCRIPTION OF THE DRAWINGS

Further objects, advantages and features of the invention will become evident from the detailed description below when read in conjunction with the accompanying drawings in which.

DETAILED DESCRIPTION OF THE PREFERRED EMBODIMENTS

Figure 1:
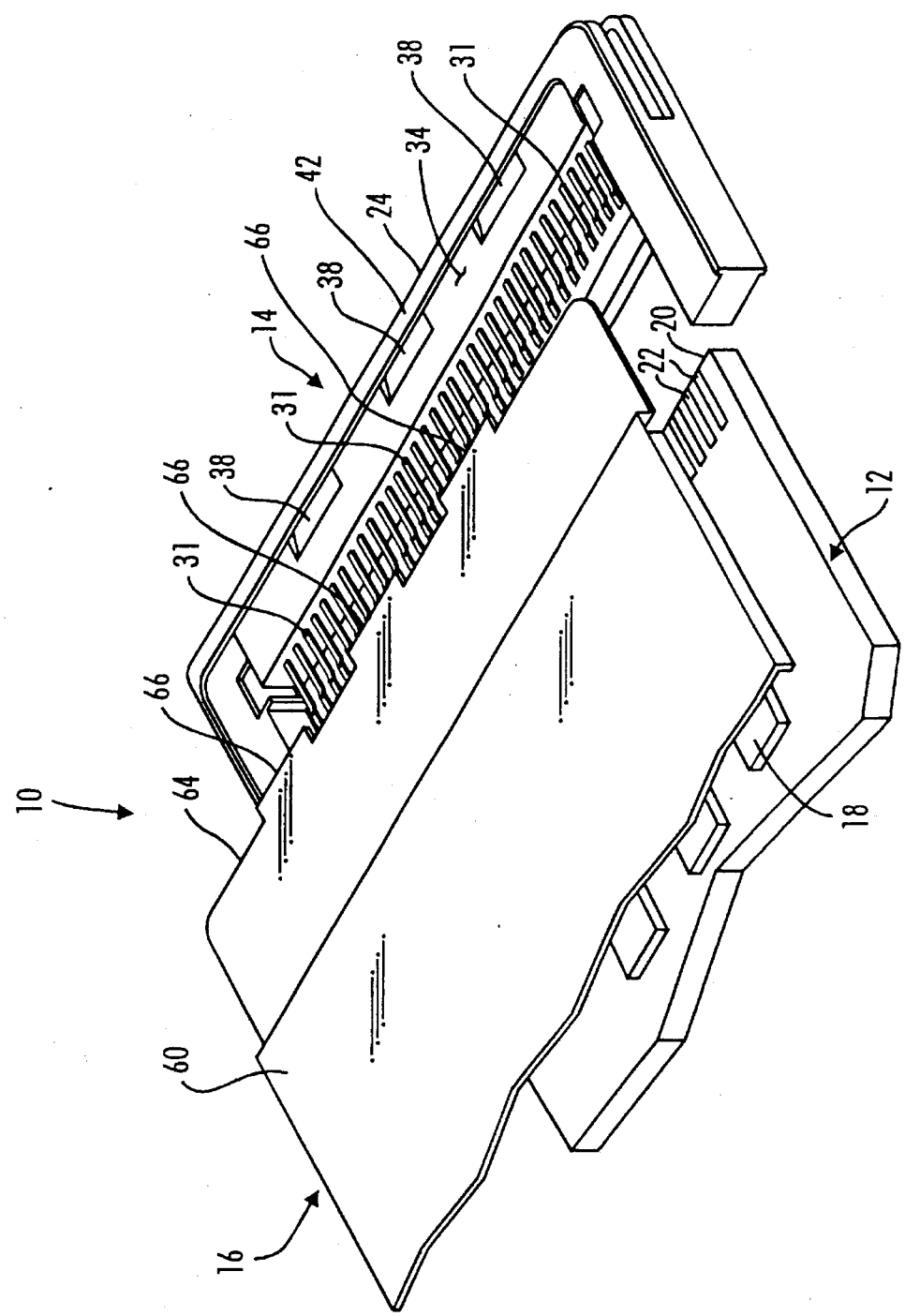
FIG. 1 is an exploded, perspective view of portions of certain of the parts of a removable memory device in accordance with the present invention.
Figure 2:
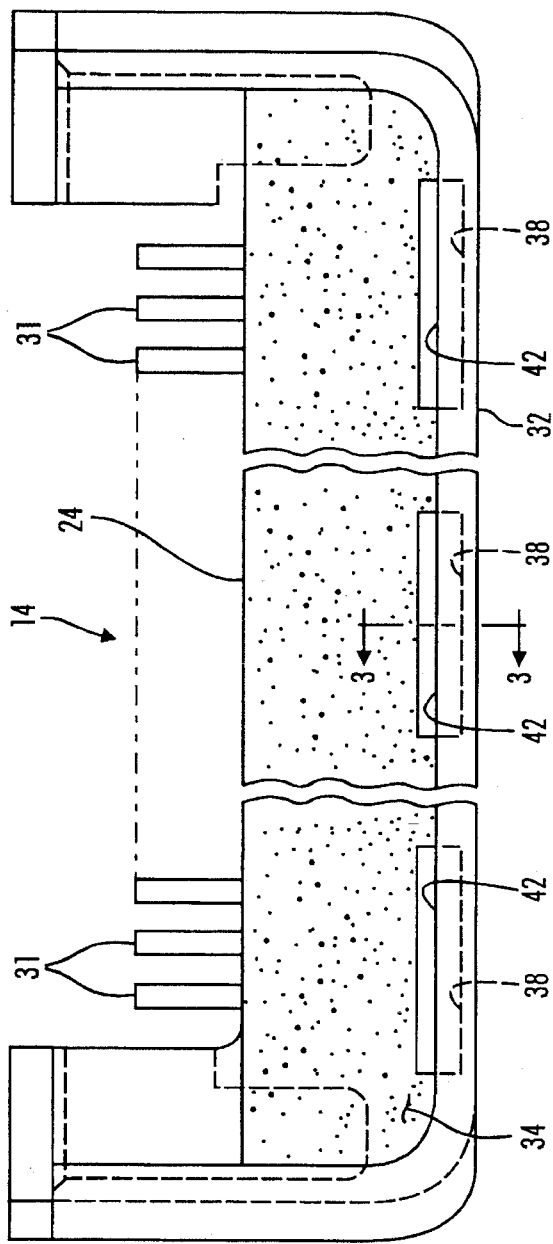
FIG. 2 is a top plan view of a multipole connector forming part of the removable memory device of the invention.

Referring to the drawings there is shown a removable memory device 10 comprising generally a substrate in the form of a printed circuit board (PCB) 12, a multipole connector 14 and a cover 16 for enclosing the PCB 12. The cover 16 is connected to the multipole connector 14 in a manner to be described. In the specific embodiment under consideration the PCB 12 carries a plurality of integrated circuit RAM packages, such as the package 18, but it will be evident to skilled artisans that the invention has applicability to other IC packages which may be mounted on a variety of substrates.

The PCB 12 has a forward edge 20 including a terminal section comprising a plurality of conductive traces 22 which may have a standard spacing or pitch of, for example, 1.27 mm. As is well known, the traces 22 are connected to the various IC packages carried by the PCB 12.

The multipole connector 14 includes an insulative connector block 24 of molded plastic or the like having upper and lower transverse rows of longitudinally extending cavities 26. Each cavity 26 contains a contact 28 having a pair of forwardly extending, opposing spring members 30 for receiving a male pin of a male connector (not shown) on the host apparatus. Each contact 28 further has a rearwardly extending spring contact finger 31 for engaging one of the traces 22 along the forward edge 20 of the PCB 12.

The connector block 24 further includes a front end surface 32 and upper and lower, parallel outer surfaces 34 and 36, respectively. Formed in the connector block 24 are a plurality of retention slots 38 spaced apart along the upper, outer surface 34 of the connector block 34 adjacent the front end surface 32. A similar set of spaced apart retention slots 40 are formed in the lower outer surface 36 of the block 24. The slots 38 and 40 are formed in the connector block during molding of the block.

The slots 38 are defined by the upper, outer surface 34 and lips 42 extending rearwardly from the front end surface 32. Slots 40 are similarly defined by the lower outer surface 36 and rearwardly extending lips 44.

Figure 3:
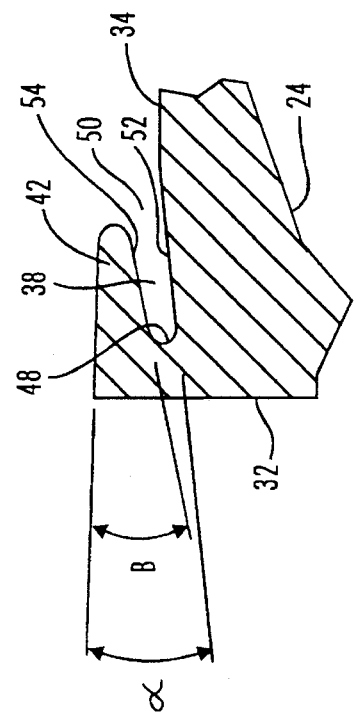
FIG. 3 is a cross section of a portion of the multipole connector of FIG. 2 as seen along the section line 3—3.
Figure 4:
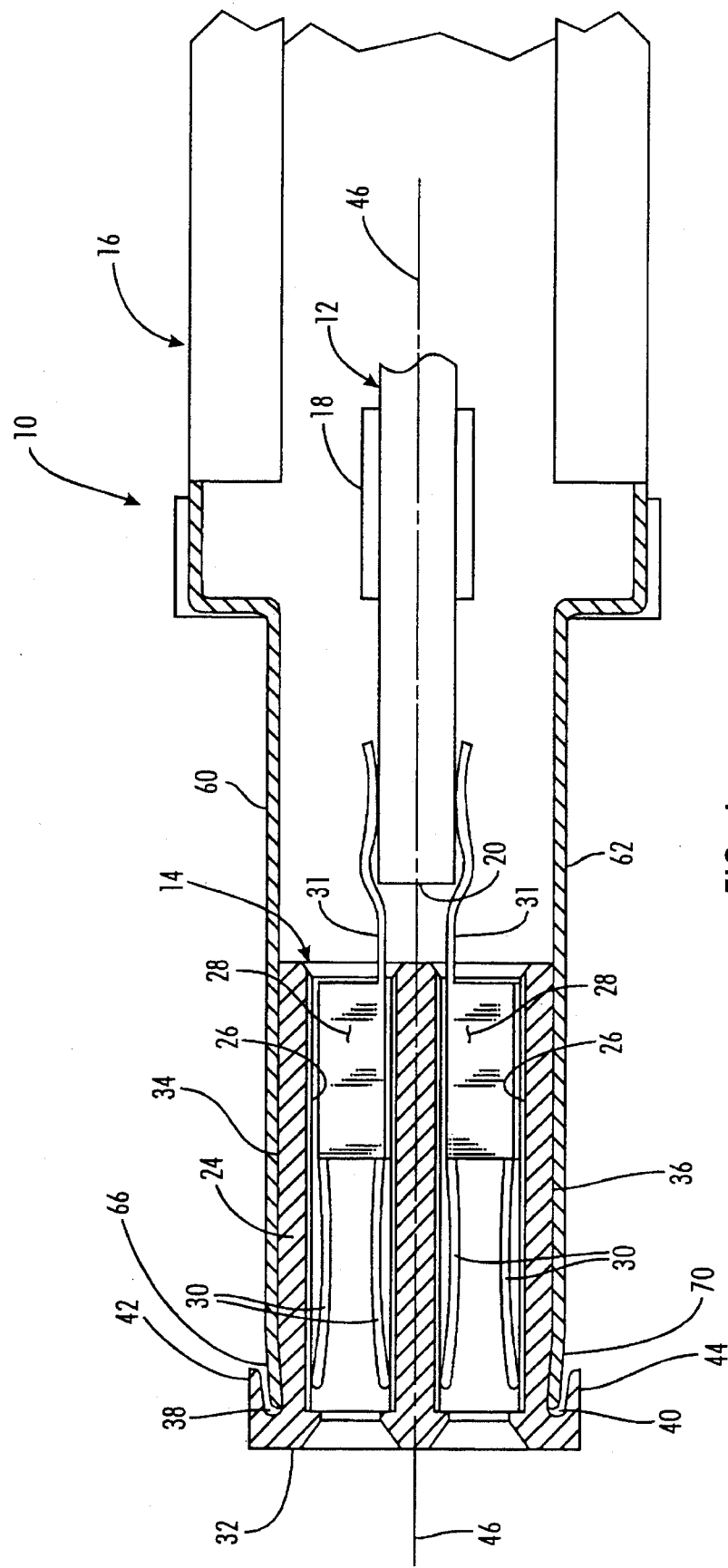
FIG. 4 is a side elevation view, partly in section, of a removable memory device in accordance with the invention.

As best seen in FIGS. 3 and 4, the retention slots 38 and 40, viewed in side elevation cross section, are disposed at angles relative to a horizontal, longitudinal center line 46 of the removable memory device 10. More specifically, the slots 38 and 40 are directed inwardly, that is, toward the center line 46 so that imaginary lines extending forwardly from the slots 38 and 40 would converge at the center line 46. The slots 38 and 40 may be set at various angles relative to the longitudinal center line 46 and are preferably tapered so that the forward extremity 48 of each slot is smaller in height than the rear extremity 50. For example, in accordance with one practical, exemplary embodiment of the invention, the lower or inner surface 52 of each slot may be oriented at an angle α of 6° relative to the horizontal while the upper or outer surface 54 of each slot may be disposed at an angle β of 10° relative to the horizontal.

The cover 16, which may be made of sheet metal or conductive plastic sheet, includes generally parallel, opposed upper and lower cover panels 60 and 62, respectively. The cover panel 60 has a forward edge 64 provided with a plurality of forwardly projecting retention tabs 66 transversely spaced so as to be in alignment and mate with the slots 38 associated with the upper outer surface 34 of the connector block 24. The retention tabs 66 are preferably bent inwardly toward the center line 46 (FIG. 4) so as to assume an angle approximating that of the slots 38. In a similar fashion, the lower cover panel 62 has a forward edge 68 provided with a plurality of forwardly projecting retention tabs 70 which, like the tabs 66, are spaced apart so as to mate with the slots 40 spaced along the lower outer surface 36 of the connector block. The retention tabs 70 are preferably also bent inwardly toward the center line 46 (FIG. 4) at an angle approximating that of the slots 40.

In light of the foregoing description, it will be seen that the assembly of the cover 16 and multi-pole connector 14 is simply a matter of sliding the cover 16 forwardly along the connector block 24 until the tabs 66, 70 latch into place within the corresponding slots 38, 40. The angular orientations of the mating retention tabs and slots assure a reliable connection between the cover 16 and the connector 14. Further, the tab and slot arrangement assures that the cover will be precisely located relative to the connector and this accurate control over the positional relationship expedites assembly of the parts.

While the present invention has been described with reference to particular illustrative embodiments, the invention is not to be restricted to those embodiments but only by the appended claims. It will be appreciated that those skilled in the art can change or modify the described embodiments without departing from the scope and spirit of the invention. For example, the number, geometry and location of the tabs and associated slots may be varied depending upon the application. The retention tabs and receiving slots may be configured or keyed so as to discourage attempts to remove the cover yet allow an authorized service technician, using special tools, to expeditiously remove the cover.

What is claimed is:

1. A circuit device adapted to be removably connected to an electronic apparatus such as a computer, the circuit device comprising:

a cover including opposed upper and lower, substantially parallel cover panels, each of the panels having a forward edge including a plurality of forwardly projecting tabs;

a substrate disposed within the cover, the substrate carrying electronic circuit elements and including a forward edge having a plurality of contacts connected to the electronic circuit elements; and a connector disposed adjacent the forward edge of the substrate and having a plurality of contact members electrically coupled to the plurality of substrate contacts, the connector having opposed, parallel, upper and lower outer surfaces, each of the outer surfaces having a plurality of slots, each slot in the upper outer surface of the connector receiving one of the tabs along the forward edge of the upper cover panel and each slot in the lower outer surface of the connector block receiving one of the tabs along the forward edge of the lower cover panel.

2. A circuit device, as defined in claim 1, in which:

the slots and tabs associated, respectively, with the upper outer surface of the connector and the forward edge of the upper cover panel, and the slots and tabs associated, respectively, with the lower outer surface of the connector and the forward edge of the lower cover panel are directed inwardly providing a secure, latched connection between the cover and the connector.

\* \* \* \* \*